US005652413A

United States Patent [19]

Mulera

[11] Patent Number: 5,652,413

[45] Date of Patent: Jul. 29, 1997

[54] SPEAKER COVER GRILLE

[75] Inventor: David T. Mulera, Ann Arbor, Mich.

[73] Assignee: Oakwood Metal Fabricating Company, Dearborn, Mich.

[21] Appl. No.: 611,947

[22] Filed: Mar. 7, 1996

Related U.S. Application Data

[63] Continuation-in-part of Ser. No. 543,390, Oct. 16, 1995, abandoned, which is a continuation-in-part of Ser. No. 355,951, Feb. 27, 1995, Pat. No. 5,565,659.

[51] Int. Cl.$^6$ .......... H05K 5/00

[52] U.S. Cl. .......... 181/141; 181/150

[58] Field of Search .......... 181/148, 150, 181/141; 381/188, 205

[56] References Cited

U.S. PATENT DOCUMENTS

| | | | |
|---|---|---|---|
| 4,439,643 | 3/1984 | Schweizer | 181/150 X |
| 4,919,227 | 4/1990 | Chicoine | 181/150 X |
| 4,934,480 | 6/1990 | Gaté et al. | 181/150 |
| 4,974,698 | 12/1990 | Smith | 181/150 |
| 5,113,968 | 5/1992 | Lemmon | 181/150 X |
| 5,416,283 | 5/1995 | Dault et al. | 181/150 |

*Primary Examiner*—Khanh Dang
*Attorney, Agent, or Firm*—John R. Benefiel

[57] ABSTRACT

A pierced metal speaker cover grille has a series of tabs extending away from the turned edge of a front cover portion, an outwardly inclined cutout section formed on each tab. The inclined cutout sections cam each associated tab inwardly as it is advanced into an aligned slot in the mounting panel, and lock behind the rear edge to secure the cover grille in place.

5 Claims, 3 Drawing Sheets

SPEAKER COVER GRILLE

CROSS-REFERENCE TO RELATED APPLICATIONS

This application is a continuation-in-part of application Ser. No. 08/543,390, filed Oct. 16, 1995, now abandoned which is a continuation-in-part of application Ser. No. 08/355,951, filed Feb. 27, 1995, which is now U.S. Pat. No. 5,565,659.

FIELD OF THE INVENTION

This invention concerns speaker cover grilles for automotive interior trim applications.

BACKGROUND OF THE INVENTION

A speaker grille construction involving a pierced metal panel has been heretofore described in U.S. Pat. No. 4,974,698 issued to the assignee of the present patent application on Dec. 4, 1990 for a "Speaker Cover Grille Installation."

As described in that patent, an expanded or perforated pierced metal cover panel has aesthetic appeal over plastic or cloth cover material and allows better sound transmission.

However, since the pierced metal cover must be constructed of mild sheet steel, conventional installation required either separate fasteners or solid spring steel tabs, or a plastic frame, substantially increasing costs.

U.S. Pat. No. 4,974,698 describes an advantageous integral tab geometry formed into the pierced metal material itself which allows snap fitting of the cover to a trim panel without the use of spring steel tabs or separate fasteners.

The object of the present invention is to provide another form of the snap-fitted cover edge shown in U.S. Pat. No. 4,974,698 which will provide a secure snap fitting assembly of the cover to the inner periphery of a trim panel defining the speaker opening.

SUMMARY OF THE INVENTION

This and other objects of the present invention which will be appreciated by a reading of the following specification and claims are achieved by a speaker cover grille having a series of tabs distributed about the perimeter of the pierced metal speaker cover grille, which are integrally formed from the pierced metal material.

The tabs extend rearwardly from the formed over rim and are each provided with a cutout section which is outwardly inclined from the tab by bending along a line of connection to the tab. The line of connection is at the bottom so that the outward inclination causes the tab to be cammed inward as the speaker cover grille is installed by advancing the tabs in slots in the trim piece cutout section then moved out behind the trim piece to lock the cover grille in position.

In a first embodiment, the cutout section is reversely formed along an intermediate line defining a knee to facilitate removal by inward camming of the tab as the speaker cover grille is pulled out.

In a second embodiment, the cutout section is straight and locks behind a rear surface of the trim piece adjacent the respective slot.

DETAILED DESCRIPTION

In the following detailed description, certain specific terminology will be employed for the sake of clarity and a particular embodiment described in accordance with the requirements of 35 USC 112, but it is to be understood that the same is not intended to be limiting and should not be so construed inasmuch as the invention is capable of taking many forms and variations within the scope of the appended claims.

Figure 1:
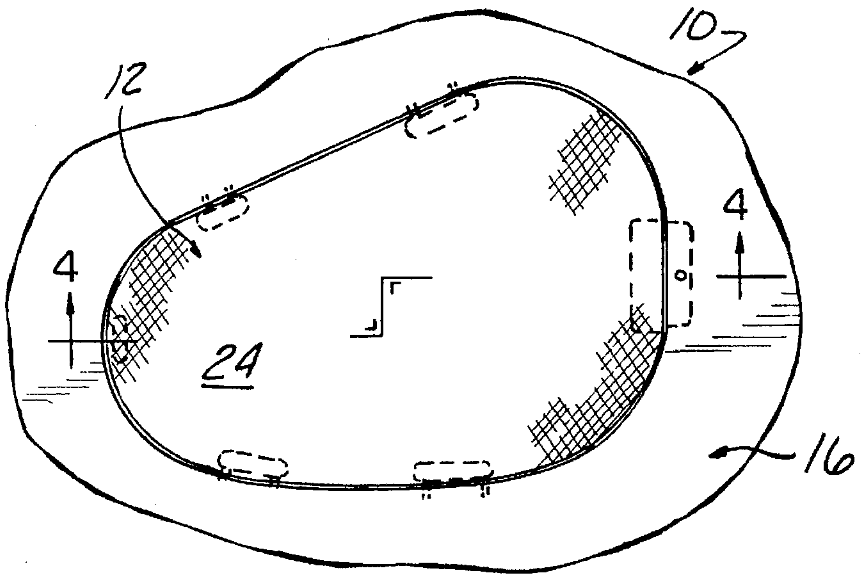
FIG. 1 is a plan view of a speaker grille installation according to the invention with the adjacent trim piece portions shown in fragmentary form.
Figure 2:
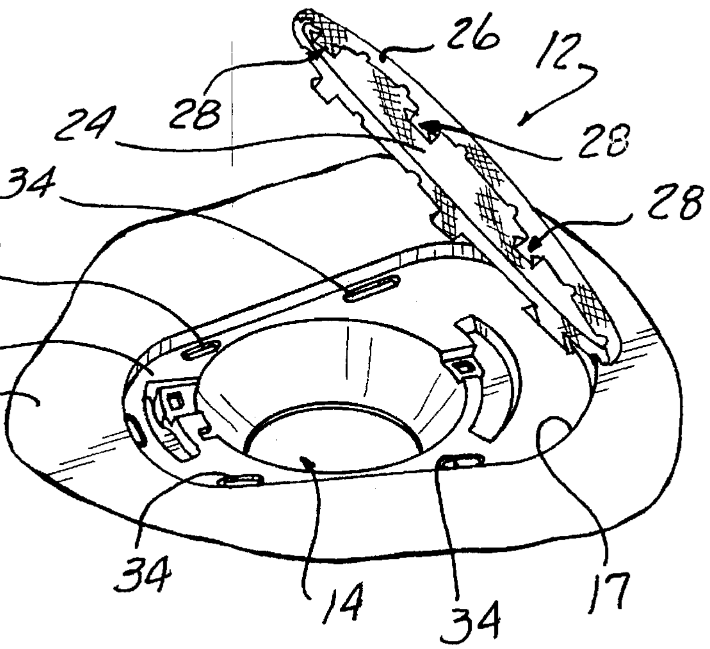
FIG. 2 is a perspective view of the speaker grille shown in FIG. 1 partially assembled to the trim piece, shown in fragmentary form.
Figure 4:
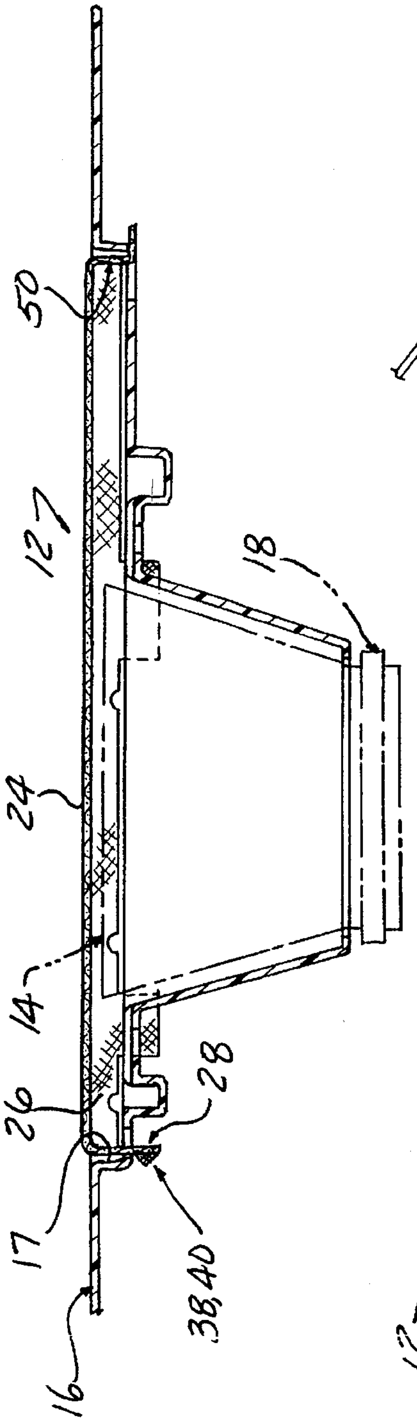
FIG. 4 is a view of the transverse section through the speaker grille installation shown in FIG. 1 taken along the line 4—4.
Figure 6:
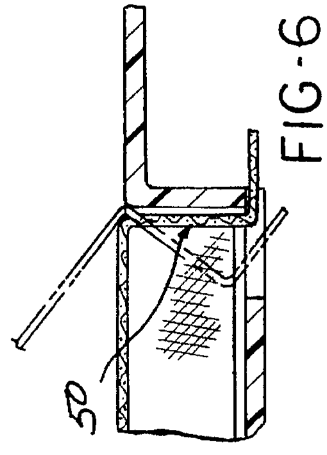
FIG. 6 is an enlarged fragmentary view of a locating tab and its engagement with the trim piece.

Referring to the drawings, and particularly FIGS. 1, 2 and 4, a speaker cover grille installation 10 is shown, in which a formed metal cover grille 12 is secured over a speaker opening 14 forming a trim piece, here comprised of a door panel 16. A speaker assembly 18 is mounted so as to allow sound waves to emanate through the speaker housing opening 14 and the holes through the speaker cover grille 12.

The speaker cover grille 12 is formed of sheet metal material which has been pierced as by being perforated by or expanded by a punching or forming operation to form a pattern of openings extending completely across the area of the cover grille 12. An open area defined by the pierced holes is thus provided, allowing the transmission of sound therethrough. Cold rolled low carbon sheet steel is required to allow the formation of openings therein since spring steel cannot easily be formed with small diameter holes. For minimum distortion, 40–50% open area should be provided, 43% having been found to be optimal for transmitting the speaker sounds therethrough.

The cover grille 12 is comprised of a generally planar main area 24 having a turned edge 26 extending around the perimeter thereof presenting a smooth, substantial appearance. The trim piece 16 is formed with a recess 17 defining the speaker opening 14 into which is interfit the turned edge 26 of the speaker cover grille 12 which has a terminus 42 abutting a surface 36 defined by the recess 17 when the speaker cover grille 12 is installed therein.

According to the concept of the present invention, one or more integral tabs 28 are distributed in a series along the turned edge 26, with a single locating hinge tab 50 also provided integral with the turned edge 26. Each tab 28 comprises a rearward extension of the turned edge 26.

Each tab 28 includes an inwardly extending planar extension section 32 being generally perpendicular to the central section 24 so as to extend inwardly beyond the turned edge 26 so as to pass through a respective one of a series of slots 34 formed in a planar surface 36 of the trim piece 16 against which the turned edge 26 abuts.

Each tab 28 is formed with a pair of ears 38, 40 formed on a respective side of the tab to project radially from the planar portion 32.

The tabs 28 are each able to undergo considerable deflection inwardly while remaining within the yieldable limits of the cover material by the presence of the planar extension section 32, which length adds to the length of the section holding the ears 38, 40.

The locating tab 30 is initially seated in one of the slots 34 at installation, and the cover grille 12 hinged thereabout to bring the tabs 28 into respective engagement with the remaining slots 34.

The locating tab 30 thus serves to correctly position the cover grille 12 to be aligned over the opening 14 for proper engagement of the tabs 28.

At least one tab 28 is provided opposite a single locating tab 30. Additional gripper tabs 28 are formed distributed in a series about the cover perimeter to increase the retention force acting on the installed cover grille 12.

Since the tabs 28 and 30 are integrally formed of the material of the cover grille 12, the proper deflection resistance will depend on the bendability of that material. It is important to avoid bending beyond the yield point of the material to insure adequate retention forces. The bendability of perforate or expanded sheet metal material will of course depend on its thickness and the geometry of the hole pattern.

Figure 3:
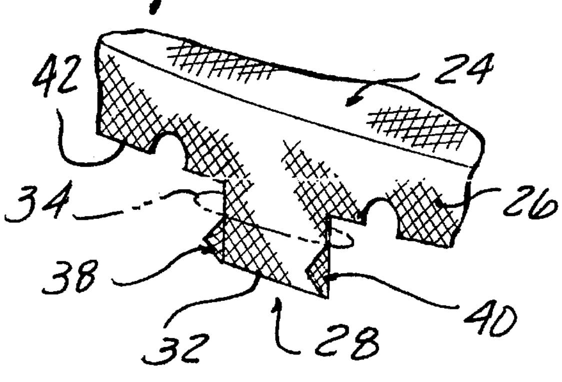
FIG. 3 is an enlarged fragmentary portion of the speaker grille shown in FIGS. 1 and 2, showing the details of a latching tab and indicating the mating slot in phantom lines.

The ears 38 and 40 are spaced below the terminus 42 of the turned edge 26 (FIG. 3) a distance on the planar section 32 so as to allow the ears 38, 40 to pass through the respective slot 34.

Each ear 38, 40 is formed with an inclined entry side edge 44 (FIG. 3A) which projects radially sufficiently to engage the side of the slot 34 as the speaker grille cover 12 is moved down towards the surface 36 of the trim piece 16 at assembly.

Figure 5:
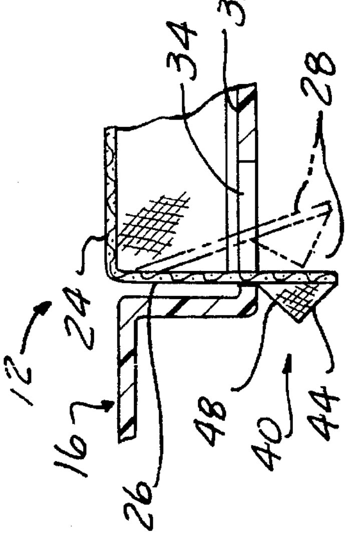
FIG. 5 is an enlarged fragmentary view of the latching tab showing the tab ear engagement with the slot perimeter edge.

As shown in FIG. 5, the inclination of the entry side edge part projecting outwardly from a location adjacent the outboard end of the tab 28 towards the cover grille main portion causes a camming action radially deflecting the planar extension portion 32 of the associated tab 28 as the ears 38, 40 move past the outer edge of the slot 34. As the ears 38, 40 move past the thickness of the trim piece material defining the slot 34, the tab planar portion 32 can again straighten, causing a return side edge 48 on each ear to engage the slot edge. The abutment of the terminus 42 results in a gripping of the trim piece material by the ear return side edge 48 engagement.

Thus, a secure mounting of the cover grille 12 to the trim piece 16 is achieved.

The length of the tabs 28 should be sufficient so that a relatively slight local deflection occurs along its length to avoid substantial yielding of the mild steel material.

The speaker cover grille 12 is nested into the recess 17 of the trim piece 16.

The return side edge 48 comprises a second part of each ear 38, 40, and is preferably also angled, but inwardly towards the tab 28 to assist in disassembly and to insure latching engagement with the edge of the slot 34.

Figure 3B:
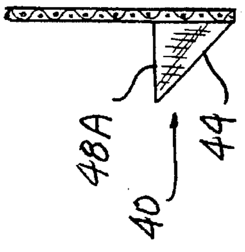
FIG. 3B is a side elevational enlarged view of a modified form of the ear portion of a latching tab.
Figure 3A:
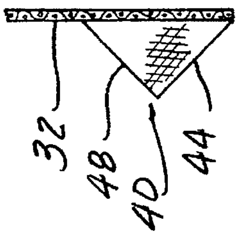
FIG. 3A is a side elevational enlarged view of a tab ear portion showing the angled entrant and return side edges for installation and removal.

However, as shown in FIG. 3B, the return side edge 48A may be only slightly angled or not angled at all.

Figure 7:
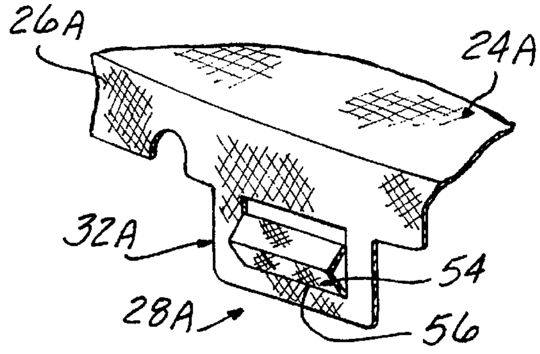
FIG. 7 is a fragmentary perspective view of a speaker grille having a modified locking tab according to the present invention.
Figure 8:
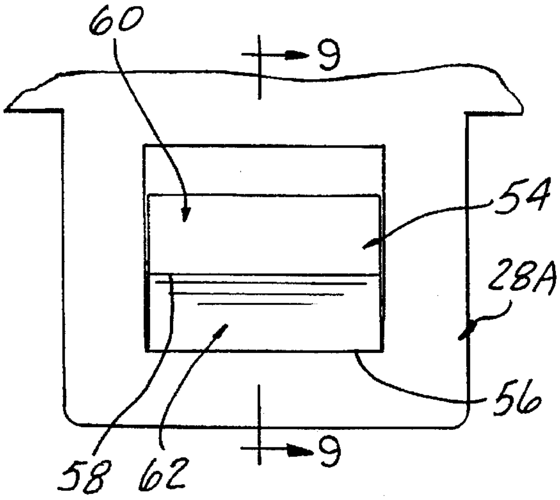
FIG. 8 is a front elevational fragmentary view of the speaker grille illustrating the locking tab shown in FIG. 7.
Figure 9:
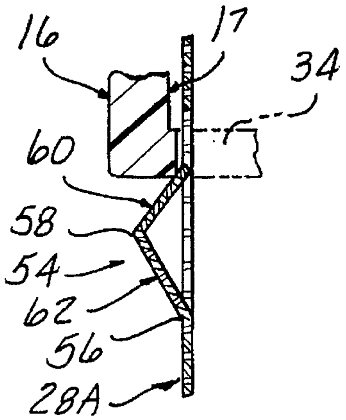
FIG. 9 is a sectional view taken through the locking tab shown in FIG. 8 along the line 9—9, with a mating portion of the trim piece shown in phantom.

FIGS. 7–9 show another embodiment of the invention in which the planar extension 32A of each of the gripper tabs 28A has a rectangular section 54 cut out of the planar extension 32A along three sides, with the fourth side constituted by a line of integral connection 56 to the tab 28A located at the bottom of the section 54 remote from the main portion 24A of the speaker grille 16. The rectangular section 54 is angled outwardly from the outboard end back towards the cover grille by bending along the line of connection 56.

In the embodiment shown in FIGS. 7–9, the outwardly inclined cutout section 54 is formed with a second bend line creating a "knee" 58 to divide the section 54 into a top part 60 and a bottom part 62, inwardly inclining the top part 60 of the cutout section 54.

The speaker cover grille 16 is inserted into the recess 17 of the trim piece 16, the inclined lower parts 62 camming the tabs 28A inwardly until the knees 58 clear the corner of their engaged slot 34. The slot corner engages the top part 60 when the grille 16 is fully inserted, holding it in position. The inward inclination of the upper part 60 allows easy removal of the speaker cover grille 16, since the tabs 28A are each cammed inward as it is pulled out.

Figure 10:
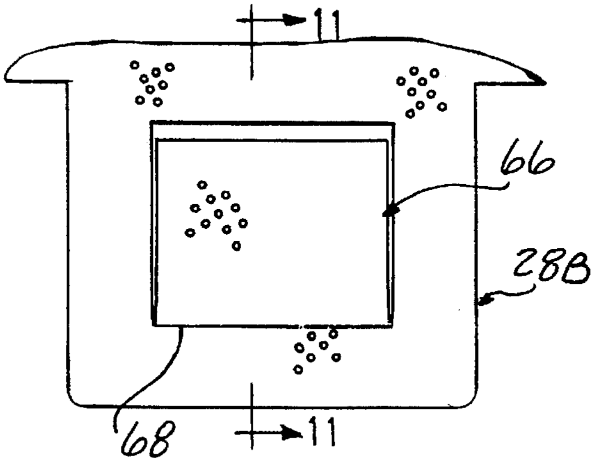
FIG. 10 is a fragmentary view of a modified form of the embodiment of the locking tab shown in FIGS. 7–9.
Figure 11:
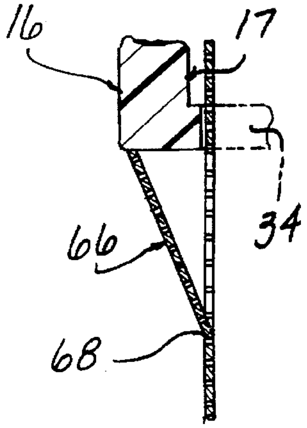
FIG. 11 is a sectional view taken through the locking tab shown in FIG. 10 along the section line 11—11, with a mating portion of the trim piece shown in phantom.

FIGS. 10 and 11 show a simplified version in which a tab 28B is formed with a rectangular cutout section 66 which is inclined outwardly by bending along the fourth side 68 defining a line of integral connection 68 to the remaining part of tab 28B located at the bottom or side remote from the main portion of the speaker cover grille 16. Thus, the end of the section 66 engages the undersurface of the trim piece 16 when fully inserted in the recess 17 to be locked in position.

Thus, removal is more difficult, but the configuration is simpler.

Figure 12:
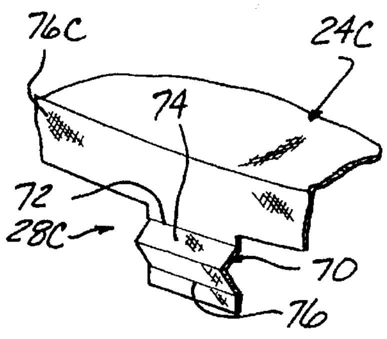
FIG. 12 is a fragmentary perspective view of a speaker grille having another alternate form of the locking tab according to the present invention.

FIG. 12 shows a tab 28C in which a section 70 constitutes the entire tab 28C. A knee is formed by bend lines 72, 74, 76. The camming causes bending along line 72, allowing the knee to pass the edge of the slot, the tab 28C snapping back to lock against the edge in similar fashion as the section 60 shown in FIG. 9.

I claim:

1. In combination, a speaker cover grille and a trim piece, said speaker cover grille covering an opening in said trim piece behind which a speaker assembly is adapted to be mounted, said cover grille:

comprised of a formed sheet of pierced sheet metal completely covered with a pattern of through holes to create an open area allowing transmission of sound therethrough, said cover grille having a central generally planar front portion and an integral formed turned edge extending rearwardly about a perimeter of said generally planar front portion;

said cover grille having at least one generally planar tab integrally formed along one side from said formed turned edge of pierced metal, said tab extending away from said formed edge in a direction generally normal to said central generally planar portion of said cover grille, and having a cutout portion projecting outwardly from remaining portions of said tab, said cutout portion having a first side joined to said tab remaining portions at a location adjacent an outboard end of said tab remote from said one side of said tab;

said trim piece formed with a first surface adjacent said trim piece opening, said turned edge of said speaker cover grille abutting said surface, said trim piece also formed with a slot allowing said at least one tab to move past said trim piece first surface, and an edge of said trim piece slot engaged by a first part of said outwardly inclined cutout portion of said tab to cause said cutout portion of said tab to be cammed inwardly as said turned edge of said cover grille moves towards abutment with said trim piece first surface;

said tab cutout portion having a second part engaging said trim piece on a second surface located past said slot to retain said cover grille after said tab is inserted in said slot.

2. The speaker cover grille according to claim 1 wherein said tab cutout portion is bent along a line intermediate said first part and said second part which are thereby angled with respect to each other to form a knee feature.

3. The speaker cover grille according to claim 2 wherein said tab cutout portion is flat, and has a projecting end lying outward of said tab remaining portions, said end comprising said second part of said tab cutout portion.

4. A speaker cover grille comprising:

a sheet of pierced metal formed with a pattern of openings creating an open area to allow transmission of sound therethrough, said pattern substantially covering a full extent of said cover grille, said cover grille having a generally planar main front portion and an inwardly turned edge about a perimeter thereof;

a series of spaced apart tabs each having one side integrally formed with said turned edge and extending away from said inwardly turned edge;

said tabs each including a planar tab main portion extending rearwardly from said side integral with said turned edge generally normally to said front portion of said cover grille;

said tabs each also formed with a cutout portion formed with a series of sides, said cutout portion of each of said tabs joined to a respective tab main portion along one side thereof located away from said integrally formed side of a respective tab and projecting outward from said planar tab main portion and said speaker cover grille main front portion, said cutout portion of each tab extending back towards said cover grille main portion from said joined side.

5. The speaker cover grille according to claim 4 wherein said cutout portion of each of said tabs is bent along a line intermediate the length of said cutout portion to form a knee.

* * * * *